US007563352B2

(12) United States Patent
Hubel

(10) Patent No.: US 7,563,352 B2
(45) Date of Patent: Jul. 21, 2009

(54) METHOD AND CONVEYORIZED SYSTEM FOR ELECTORLYTICALLY PROCESSING WORK PIECES

(75) Inventor: Egon Hubel, Feucht (DE)

(73) Assignee: Atotech Deutschland GmbH, Berlin (DE)

( * ) Notice: Subject to any disclaimer, the term of this patent is extended or adjusted under 35 U.S.C. 154(b) by 500 days.

(21) Appl. No.: 10/488,352

(22) PCT Filed: Oct. 21, 2002

(86) PCT No.: PCT/EP02/11764

§ 371 (c)(1),
(2), (4) Date: Mar. 1, 2004

(87) PCT Pub. No.: WO03/038159

PCT Pub. Date: May 8, 2003

(65) Prior Publication Data
US 2004/0245093 A1 Dec. 9, 2004

(30) Foreign Application Priority Data
Oct. 27, 2001 (DE) .................... 101 53 171

(51) Int. Cl.
C25D 21/12 (2006.01)
B23H 7/26 (2006.01)
(52) U.S. Cl. ........................... 205/82; 204/198
(58) Field of Classification Search ................. 205/96, 205/82, 686; 367/128; 204/198
See application file for complete search history.

(56) References Cited

U.S. PATENT DOCUMENTS 3,347,770 A * 10/1967 Valles et al. ................. 205/82
4,459,183 A 7/1984 Brady et al.

(Continued)

FOREIGN PATENT DOCUMENTS

DE 32 36 545 A1 10/1981

(Continued)

OTHER PUBLICATIONS

Patent Abstracts of Japan, dated Jul. 20, 1986. Title; Electroplating Device; Author; JPO & Japio, 1 page.

Primary Examiner—Roy King
Assistant Examiner—Jessee R. Roe
(74) Attorney, Agent, or Firm—Paul & Paul

(57) ABSTRACT

In order to avoid an edge-effect (increased electrical field line density at the edges of electrolytically to be processed work pieces) during the electrolytic processing of work pieces $3.x$ in a conveyorized system, the electric currents originating from various counter electrodes $5.x$ in the plant are set to values in function of the electrolytically to be processed surface areas of the work pieces $3.x$ as far as they are located directly opposite the respective ones of the various counter electrodes $5.x$. Moreover, the distance between the work pieces $3.x$ and the counter electrodes $5.x$ is chosen to be 50 mm maximum. Means 19 for individually controlling and adjusting every single current supply unit $15.x$ of the counter electrodes $5.x$ are provided for this purpose. Said means 19 are configured in such a manner that the respective electric currents originating from the various counter electrodes $5.x$ are settable to values in function of the electrolytically to be processed surface areas of the work pieces $3.x$, as far as they are located directly opposite the respective various counter electrodes $5.x$.

17 Claims, 3 Drawing Sheets

U.S. PATENT DOCUMENTS

| | | | | |
|---|---|---|---|---|
| 5,292,424 | A | * | 3/1994 | Blasing et al. ................. 205/82 |
| 5,441,619 | A | | 8/1995 | Kawachi et al. |
| 6,064,629 | A | * | 5/2000 | Stringer et al. .............. 367/128 |
| 6,071,400 | A | * | 6/2000 | Schroder et al. ............ 205/686 |
| 6,120,671 | A | * | 9/2000 | Karner et al. ............. 205/147 |
| 6,395,163 | B1 | * | 5/2002 | Schneider et al. ............. 205/93 |

FOREIGN PATENT DOCUMENTS

| | | |
|---|---|---|
| DE | 36 45 319 C2 | 1/1988 |
| DE | 39 39 681 A1 | 6/1991 |
| DE | 39 39 681 C2 | 6/1991 |
| DE | 44 17 551 A1 | 11/1995 |
| DE | 44 17 551 C2 | 11/1995 |
| JP | A-H05-501284 | 5/1991 |
| JP | U-H05-035855 | 7/1991 |
| JP | A-H05-025699 | 2/1993 |
| JP | A-H06-346295 | 12/1994 |
| JP | A-H09-071894 | 3/1997 |
| JP | 2000045099 | 2/2000 |
| JP | 2000096299 | 4/2000 |
| JP | A-2001-123298 | 5/2001 |
| WO | WO 98/49375 | 11/1998 |

* cited by examiner

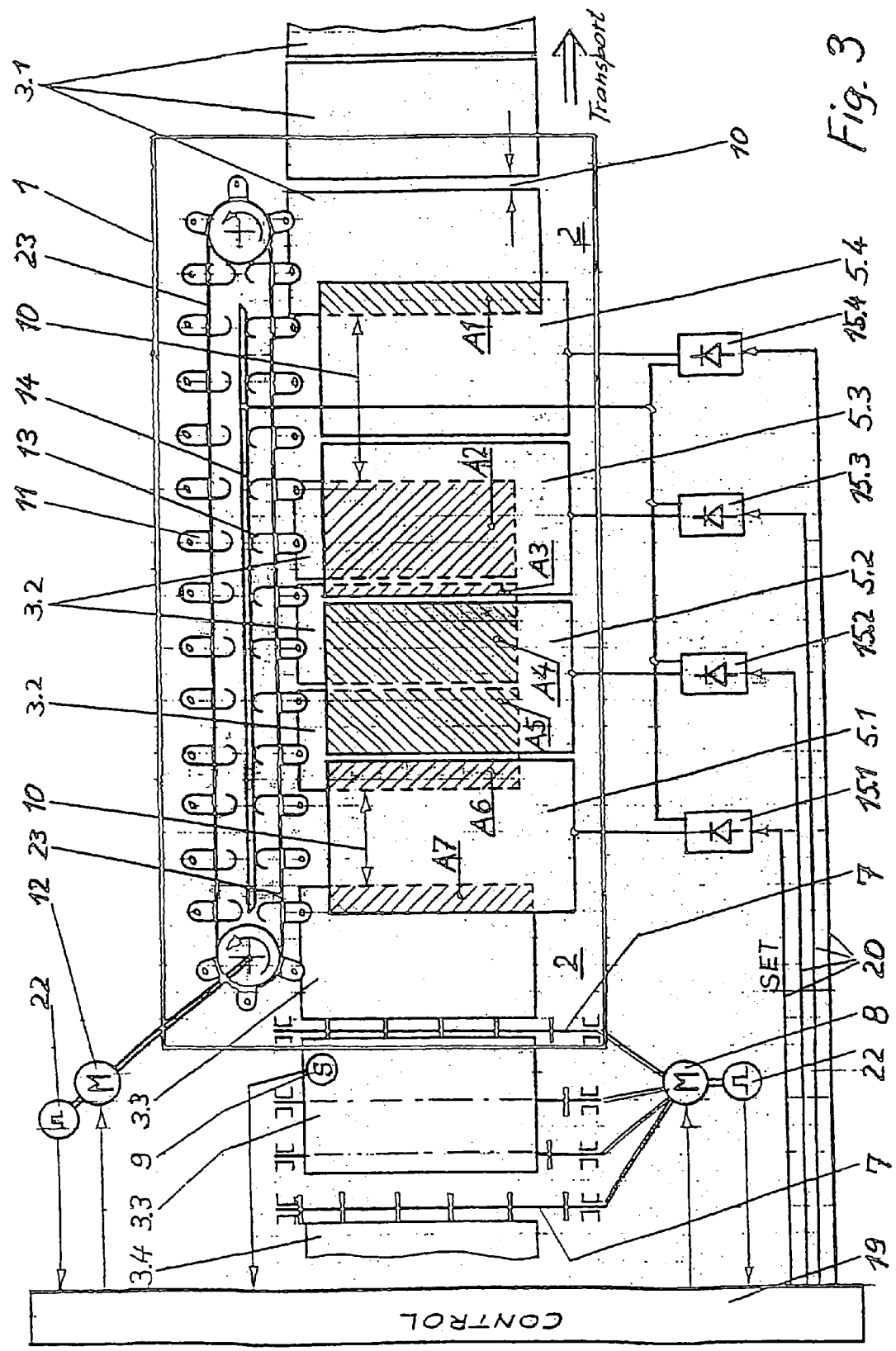

METHOD AND CONVEYORIZED SYSTEM FOR ELECTORLYTICALLY PROCESSING WORK PIECES

BACKGROUND OF THE INVENTION

The invention relates to a method and to a conveyorized system for electrolytically processing work pieces, more specifically to a method and to a conveyorized system for processing electrical printed circuit boards and other electrical circuit carriers.

Conveyorized systems as they are utilized in the printed circuit board technique for example substantially comprise a plating tank which is filled with an electrolyte and in which anodes and cathodes are arranged. A transport device conveys the work pieces to be processed through the plant, the work pieces being held in a vertical or horizontal orientation in the case of board-shaped work pieces. The transport device may be a device using transport rolls or transport clamps. For electrolytic etching, the work pieces are anodically and the counter electrodes cathodically polarized. For electrolytic metal-plating, the work pieces are cathodically polarized; the counter electrodes are the anodes. Electrolytic contact of the work pieces may be made through contact wheels or contact clamps. DE 32 36 545 A1 discloses for example a device for electroplating in which contact wheels are provided for electrically contacting electrical printed circuit boards conveyed in a horizontal orientation and in a horizontal direction of transport through a conveyorized system. Further, DE 36 45 319 C2 discloses a plant for electrolytically processing electrical printed circuit boards in which the boards are electrically contacted by way of contact clamps which also convey them through the plant. In this case, the work pieces may, or may not, have the shape of a board. The work pieces may also be electrically contacted by contact rolls. In the case of board-shaped work pieces, contact rolls extend over the entire width of the work pieces transverse to the direction of transport. To make electrical contact, it is also known to use segmented and non-segmented contact wheels that roll off the border of the board-shaped work pieces, such as electrical printed circuit boards for example.

For easy operation by the operator staff and for reasons of construction a conveyorized system usually contains several separate counter electrodes. During etching, the counter electrodes must often be removed for stripping in order to remove the metal deposit. When soluble anodes are used in electrolytic metal-plating methods, they must often be removed for purposes of maintenance, more specifically for cleaning and metal replacement. Viewed in the direction of transport, insoluble anodes often also consist of discrete portions.

For economical reasons, the counter electrodes located opposite one side of the work pieces are in practice supplied with electric current by means of one single rectifier. The counter electrodes located on the other side of the work pieces are supplied with current through another rectifier. In the printed circuit board technique, boards and films of various sizes are electrolytically processed in such a conveyorized system. They are transported a short distance apart or closely together in a column. To prevent too high a current density at the edges of the work pieces (edge-effect: increased electric field line density at the edges of the printed circuit boards) it has become known to use technically very complicated, adjustable, electrically isolating shields.

For this purpose, WO 98 49 375 A2 for example discloses a device for electrolytically processing electrical printed circuit boards in which screening shields are provided between the plane of transportation of the electrical printed circuit boards and the counter electrodes. Each shield is configured to form at least two substantially paralleled flat parts, the one shield part being arranged opposite the plane of transportation and the other shield part opposite the counter electrodes. The shields are slidably carried substantially transverse to the conveying direction. The cost involved in using such shields is high, though.

Another disadvantage of these shields is that, although these shields permit to achieve uniform coating thickness distribution even in the lateral border regions of the electrical printed circuit boards during electrolytic metal-plating, the leading and trailing edges of the printed circuit boards extending transverse to the direction of transport cannot be protected by shields since they are conducted through the plant in a continuous manner, being electrolytically processed thereby.

At the start of the production run, there are no printed circuit boards in the electroplating plant. Due to the edge-effect, the leading edge of the first printed circuit board entering the plant is processed at too high a current density. As a result thereof, the other regions of this first printed circuit board, and possibly those of the following second printed circuit board as well, are processed at too low a current density. This leads to coating thickness distribution flaws on the surface thereof which cannot be avoided using the slidable shields described in WO 98 49 375 A2 either.

In order to avoid the edge-effect at the leading and trailing edges of the printed circuit boards conducted through the plant, a plant for electrolytically metal-plating printed circuit boards must in practice be filled with dummies first (dummies: printed circuit boards unsuited for production that are used instead of the material for production). Only then can the rectifiers for supplying current be put into operation and the production boards may follow. In this way burns at the leading edge and coating thickness flaws on the production boards are avoided. During electrolytic metal-plating, burns lead to porous to powder-like metal deposits. They are occasioned by a current density which is too high for the electrolyte used. This formation of powder is not desired in the case of dummies either since, during the metal-plating of the dummies, a metal powder thus forms which, due to the turbulent flow past the dummies as they are conducted through the plant, is detached from the surfaces thereof and is carried into the electrolyte of the working area. Later, these particles are also brought to the surface of the production boards. There, they are co-deposited, which results in a disadvantageous surface roughness. Although this roughness may be reduced using complicated electrolyte filters, it cannot be avoided altogether. Therefore, burns must completely be prevented from occurring during the electrolytic metal-plating of printed circuit boards in the fine line printed circuit technique in order to avoid the production of scrap. At the end of the production run, in the case of gaps in the column of printed circuit boards or when there is a change in product, in which the printed circuit areas and/or the current density change, the dummies must also be treated the same way as described for the start of the production run since in this case as well the border regions of the printed circuit boards extending transverse to the direction of transport would be processed at an increased current density and adjacent regions on the boards would be processed at a reduced current density if dummy boards were not used. To fill the plant with dummies is very uneconomical especially when the product to be processed is often changed not the least reason being that a sufficient number of dummies must be available at the plant. For reasons of cost, the dummies are used several times so that metal layers of increasing thickness form thereon when they are used in metal-plating plants. Therefore, the coating thickness is usually much greater than the initial coating thickness on printed circuit boards to be produced so that the electrical conductivity of the metal layer is 10 to 1000 times higher than the conductivity of the electrolytically to be processed layer on the production boards. As a result thereof, the dummies are electrolytically processed in excess to the disadvantage of the production boards. Mostly, the dummies are only scrapped when they risk to damage the plant because they have become too heavy as a result of the great coating thickness or too sharp-edged due to metal nodules for example. For the reasons mentioned, it is uneconomical and, as a result thereof undesirable, for the operator of a conveyorized system to have to work with dummies in order to avoid the disadvantageous edge-effect.

During a continuous production, the distance from one printed circuit board to the following in a column of identical printed circuit boards must be small. In the ideal case, the distance should be zero. In practice, at mean current densities (6 A/dm$^2$ for example), distances of up to 15 mm are tolerable when the useful area on the very printed circuit boards only begins at a distance of 20 mm from the border thereof. Today's requirements to higher current densities (12 A/dm$^2$ for example) and narrower, non-usable border areas add to the problem arising from the edge-effect. Therefore, the spacing from one printed circuit board to the other must be smaller and more precisely met.

DE 39 39 681 A1 discloses a method for controlling the run in conveyorized electroplating plants in which the spacing between electrical printed circuit boards being conveyed one behind the other through the plant are sensed either directly or by way of the position of the printed circuit boards and in which the electrical currents at the anodes are turned on or off according to the result of this sensing in such a manner that the electrical field line density is approximately the same in all of the regions of the printed circuit boards. Sensors sense the distance between the successive printed circuit boards. If there is an excessive spacing in the succession of boards, those lower and upper anodes are always turned off that are at that moment located below or above the gap in the succession of boards during the transport of the printed circuit boards through the plant. Field line concentration and the resulting increased deposits on the leading and trailing edges of the printed circuit boards are to be avoided as a result thereof. In practice, this is also the case. It will be easily understood though that, as the anode pairs are turned off one after the other, not only the edges of the printed circuit boards conducted past the turned off anodes are not electrolytically metal-plated, but the entire region of the printed circuit boards as well over a length, viewed in the direction of transport, that corresponds approximately to the anodes that have been turned off. Therefore, the areas of the printed circuit boards located behind a leading edge and in front of a trailing edge are not electrolytically metal-plated or too high current densities are generated at the front and/or rear edges. Moreover, when the anodes are turned off in this way, the current of the turned off anodes is deviated to the turned on anodes so that metal-plating is carried out at an accordingly undesired higher current density. This method still permits to avoid burns and the resulting roughness of the metal deposited. It is also used for this purpose. However, this technique cannot prevent the at least two printed circuit boards located in front of and behind a gap in the printed circuit board column from being scrap. As the printed circuit boards are becoming increasingly expensive as a result of the fine line printed circuit technique and the SBU-technique (sequential build up), this scrap is not tolerated either.

In the SBU-technique, an all-over layer of electroless copper of a thickness of e.g., 0.5 µm which is to be electrolytically metal-plated is used. As compared to the electrolytic copper layers of the current printed circuit board technique of a thickness of 5-17.5 µm, this thin layer has a high ohmic resistance. As described herein above, at least part of the plant must be filled with dummies before the printed circuit boards are allowed to enter in order to permit the electrolytic metal-plating of the production boards without scrap. As compared to the SBU layer made of electroless copper, the dummies have an approximately 1000 times higher electrical conductivity. If SBU boards are introduced into the plant after dummies or if they exit the plant in front of dummies, the electrolytic current of the anodes is not distributed proportionally with regard to the surface area onto the various neighboring boards. The electric current substantially flows onto the highly conductive dummy boards. Virtually the SBU boards are not electrolytically metal-plated. If insoluble anodes are used in a chemically etching electrolyte, more specifically when the electrolyte contains compounds of a redox couple, e.g., $Fe^{2+}/Fe^{3+}$ compounds, there is a risk that regions of the SBU boards located far from the contacts are etched, that is to say completely destroyed. At best, the second or third SBU board behind or in front of a dummy is usable under these conditions. That these expensive SBU boards have to be scrapped is not accepted either.

In order to adjust in ideal manner the electrolytic metal-plating current for a first work piece immersed into an electrolyte, Patent Abstracts of Japan to JP 61133400 A suggests an electroplating device provided with an elongated plating cell for work pieces to be processed containing plating liquid and with anode plates arraying in series and separately supplied with current. The work pieces are sunk into the plating liquid at one end, the supply current of the rectifiers being gradually increased with the speed at which the work piece is sunk into the plating liquid. Burns are thus avoided.

In order to avoid the point effect during the electrolytically processing of fine circuit traces on electrical printed circuit boards which causes a varying electrical field line density to result in locally different processing effects on circuit traces of varied width, DE 44 17 551 C2 suggests to keep constant the distance between the printed circuit boards and the anodes by using electrically isolating distance members, said distance being maximum 30 times the nominal width of the narrow circuit traces.

SUMMARY OF THE INVENTION

It is therefore the object of the present invention to provide a method and a conveyorized system by means of which the drawbacks described may be avoided.

It is more specifically an object of the invention to permit electrolytic processing of a succession of work pieces, more specifically of electrical printed circuit boards and other electrical circuit carriers in conveyorized systems, that are spaced any distance apart in their successive order without the described edge effect occurring and without burns being generated during the electrolytic metal-plating process.

It is moreover a further object of the present invention to make possible that these problems do not occur even if dummies and screening shields are not used, above all while the work pieces are entering and exiting the system and during a change of product, when the electroplating command data, for the current density in particular, are being changed during processing.

It is another object of the present invention that occurrence of processing flaws due to too high or too low local current densities applied to the work pieces do not occur under the production conditions mentioned.

The solution to this object is achieved by the method described in claim 1 and by the conveyorized system according to claim 16.

By conveyorized system a device is meant in which the work pieces are conveyed in a horizontal direction of transport while being electroplated. Horizontal conveyorized systems designate devices in which the work pieces are oriented horizontally during transport and vertical conveyorized systems devices in which the work pieces are oriented vertically.

By electrical printed circuit boards such electrical circuit carriers are meant that consist of board-shaped laminate that may be composed of several dielectric and metallic layers and may have holes (through holes, buried holes and blind holes). I.a., the term may also include such configurations that have not the shape of a board and that serve for the electrical connection of electrical components that are fastened and electrically contacted on these circuit carriers. Three-dimensional configurations provided with circuit trace structures may also be meant thereby. Moreover by electrical printed circuit boards other electrical circuit carriers are meant as well such as for example chip carriers including hybrid systems. In principle the term work pieces is not only to be construed as electrical printed circuit boards only, but as any product serving other purposes as well.

Inasmuch as herein after and in the claims it is indicated that the work pieces are arranged opposite the counter electrodes, it is meant that the counter electrodes and the work pieces are arranged a determined distance apart, preferably in paralleled planes in which the counter electrodes and the work pieces are located when both the counter electrodes and the work pieces are board-shaped. In other cases, when the counter electrodes and the work pieces are configured to have a complicated three-dimensional shape, it is meant thereby that the counter electrodes and the work pieces are arranged a predetermined distance apart, certain surfaces of the counter electrodes and of the work pieces facing each other and being spaced a mean distance apart.

Inasmuch as it is indicated, herein after and in the claims, that the electric currents originating from the various counter electrodes are set to values in function of the electrolytically to be processed surface areas of the work pieces, as far as they are (momentarily) located directly opposite the various counter electrodes, it is meant that the various current values may substantially be represented as a function of the electrolytically to be processed surface areas of the work pieces that (momentarily) lie directly opposite the respective one of the various counter electrodes. This does not preclude that the various current values may additionally depend on other influencing factors. The electrolytically to be processed surface areas are formed by the electrically conductive regions on the surface of the work pieces. Electrically non-conductive regions do not constitute electrolytically to be processed surface areas. Accordingly, the electrolytically to be processed surface area of a work piece may correspond to the overall surface area of the work piece or to only a fraction thereof.

Inasmuch as it is indicated, herein after and in the claims, that the relative overlap between work pieces and a counter electrode is determined, the vertical projection of the counter electrode onto the surface of the work piece is meant thereby, as far as the work piece and the counter electrode are substantially paralleled.

The method of the invention and the conveyorized system of the invention are directed to the electrolytic processing of work pieces, more specifically of electrical printed circuit boards and other electrical circuit carriers.

In the method, the work pieces are conveyed one after the other through the system in one direction of transport. The work pieces are electrolytically processed by means of electric currents originating from counter electrodes located one behind the other in the direction of transport as the work pieces are conducted past the counter electrodes. The electric currents originating from the various counter electrodes are set, according to the invention, to values in function of the electrolytically to be processed surface areas of the work pieces, as far as they are located directly opposite the various counter electrodes. Moreover, it is made certain that the work pieces are conducted past the counter electrodes at a distance of 50 mm maximum, preferably of 2-15 mm.

The conveyorized system in accordance with the invention is comprised of:

a. a device for transporting the work pieces through the system in one plane of transportation and in one direction of transport,
b. at least two counter electrodes located behind each other in the direction of transport and arranged along the plane of transportation, the counter electrodes being spaced from the plane of transportation by a distance of 50 mm maximum, preferably of 2-15 mm,
c. at least one current supply unit for a respective one of the counter electrodes,
d. means for individually controlling every single current supply unit, said means being configured in such a way that the electric currents originating from the various counter electrodes are respectively settable to values in function of the electrolytically to be processed surface areas of the work pieces, as far as they are (momentarily) located directly opposite the various counter electrodes.

Moreover the conveyorized system preferably comprises a device for electrically contacting the work pieces and means for contacting the processing fluid with the work pieces and the counter electrodes.

As contrasted to the method described in DE 39 39 681 C1, the current of the various counter electrodes is not completely turned off when being conducted past the gaps between the work pieces and turned on again once it past them. Here, the current of every single counter electrode is individually controlled and set, the electrolytically to be processed surface area of the work pieces moved past the respective one of the counter electrodes at that moment being taken into consideration for the control thereof. As a result thereof, the current is accurately adjusted according to need as the work pieces are moved past so that the disadvantageous edge-effect on the borders of the work pieces extending transverse to the direction of transport is avoided. Accordingly, it is no longer necessary to use dummies when work pieces are entering or exiting the plant or in gaps between the work pieces for example, when e.g., work pieces are to be processed one after the other under various production conditions. Accordingly, gaps of any size may be provided between work pieces conducted one behind the other through the system without any edge effect even with no dummies placed in these gaps. The currents are computed in the control system from $I = J \cdot A$ (I: current, J: current density, A: area).

In that the currents I at the various counter electrodes are also set individually and only according to the surface areas A of the work pieces being conducted past them, the disadvantage arising when carrying out the method described in DE 39 39 681 C2 can be overcome which is that the electric current automatically increases at other counter electrodes when the current at one counter electrode is reduced or vice versa. In order to permit the individual setting of the electric currents at the various counter electrodes according to the invention, the currents of all of the counter electrodes are set and controlled independent of one another. For this purpose, at least one current supply unit for each counter electrode and means for individually computing, controlling and setting every single current supply unit are provided.

In a preferred embodiment of the invention, the electric current originating from one single counter electrode is set in such a manner that the electrolytically to be processed surface areas of work pieces, as far as they are located directly opposite a respective one of the counter electrodes are determined and that the electric current is derived from a direct correlation of the current with the sum of the determined electrolytically to be processed surface areas. For this purpose, means for individually controlling and setting every single current supply unit are provided, said means being configured in such a manner that the electric current originating from a respective one of the counter electrodes is set as a function of the electrolytically to be processed surface areas of the work pieces and the relative overlap of these work pieces with said counter electrode.

The afore mentioned direct correlation of the electric currents originating from the various counter electrodes and the sum of the surface areas of the work pieces, as far as they are located opposite the various counter electrodes is more specifically the electric currents being proportional to the electrolytically to be processed surface areas of the work pieces, as far as they are located directly opposite the respective one of the counter electrodes.

The electrolytically to be processed surface area of a work piece, as far as it is located directly opposite one single counter electrode, may be determined from the total electrolytically to be processed surface area of the work piece and a relative overlap of the work piece with the counter electrode.

The relative overlap between a work piece with one single counter electrode is more specifically determined by determining the actual position of the work piece relative to the counter electrode and by calculating therefrom the overlap, considering the shape of the work piece and the shape of the counter electrode. To ascertain the actual position of the work piece in the conveyorized system, the instant of time may be determined first at which the work piece is conducted past a predetermined position at the conveyorized system. The work piece is then logically tracked in the conveyorized system, starting from this position. In the conveyorized system, the work piece is logically tracked more specifically by either determining the distance covered by integrating the momentary conveyor speed of the work piece over time or by adding impulses of an incremental or absolute displacement encoder. One impulse of a displacement encoder corresponds for example to a distance of 1 mm covered by the work pieces in the direction of transport.

To ascertain the position of the work pieces in the conveyorized system, means for sensing the position of the work pieces in the system are provided. The means for sensing the position may be comprised of at least one sensor for determining the instant of time at which a work piece is conducted past said sensor and of means for logically tracking said work piece, starting from the sensor position. The means for logically tracking the work piece are preferably means for integrating the momentary conveyor speed of the work piece over time or for computing and adding displacement impulses of an incremental or absolute displacement encoder.

The actual position of the work piece in the conveyorized system may be determined preferably in time intervals of up to 20 sec maximum or after the work piece has been advanced up to 60 mm maximum in the direction of transport. More specifically when the transportation speed is slow, at a speed of 0.3 m/min for example, the time intervals may be long.

In order to take into consideration, during controlling and setting of the electric currents originating from the various counter electrodes, the fact that the work pieces may possibly have various electrical conductivities, for example because the work pieces are made of an electrically non-conductive material with a very thin electric metallic coating such as printed circuit boards that are processed according to the SBU method, the electric currents originating from the various counter electrodes are additionally adjusted by a correction factor in function of the electric conductivity of the work pieces conducted past the respective one of the counter electrodes in such a manner that burns of metal deposits are avoided. For, if this condition were not taken into consideration, electrically less conductive work pieces could not be processed satisfactorily since e.g. a thin metallic coating layer would be damaged by too high a current. In that the current is respectively processed by multiplication by a correction factor less than 1, gentle processing conditions for the electrolytic treatment may be achieved. During metal plating, this correction factor is continuously or gradually raised to 1, starting from a small value, as the thickness of the metal deposit increases. The thickness of the metal electrolytically deposited onto a work piece increases in the direction of transport and, as a result thereof, from one counter electrode to another past which the work piece is being conducted. Under certain conditions, a correction factor may be selected which is greater than 1. This is the case for example when the electric current for a certain work piece is to be raised above the set point of the current density after electrolytic processing has been performed at a current density less than the set point of the current density in an effort to compensate for the reduced prior electrolytic processing effect.

The distance at which the work pieces are conducted past the counter electrodes is preferably selected in function of the electric current density at the work pieces. If for example a high electric current density is set, the distance to be adjusted is to be smaller than when the current density chosen is smaller. By adjusting a relatively small distance between the plane of transportation in which the work pieces are conveyed and the counter electrodes, the edge-effect is reduced since the distance relative to spacings between electrically conductive surface areas on the work pieces is reduced. Since the edge-effect is more specifically experienced at high current density, it is more specifically necessary to reduce the spacings under these conditions.

As the distance between the counter electrodes and the plane of transportation in which the work pieces are conveyed is relatively small and is to be adjustable to an extremely low value, it is advantageous to provide an electrical insulation permeable to electric field lines between the plane of transportation and the counter electrodes in order to prevent a short between the counter electrodes and the work pieces.

Thanks to the method according to the invention and to the conveyorized system, the work pieces may be processed without using dummies. This is also possible when work pieces that have to be processed in different ways are to be processed directly one after the other. In such a case it is possible to process the work pieces in direct succession without major gap in the transportation path. Since in such cases, the electric current originating from the counter electrodes must often be changed when one type of work pieces is replaced by another, the work pieces must be separated from one another by a gap extending in the direction of transport as they are conducted through the conveyorized system, said gap being at least as long as the extension of one counter electrode in the direction of transport. Using conventional methods in this case, dummies would have to be placed in these gaps in order to avoid the edge-effect. Since the electric currents originating from the counter electrodes are set in function of the electrolytically to be processed areas of the work pieces, as far as they are located directly opposite the respective one of the counter electrodes according to the invention, it is not necessary to use dummies so that the afore mentioned problems do not arise.

If work pieces are processed in the conveyorized system that require different electrolytic processing, it may be necessary to vary the conveyor speed of the work pieces as they are conducted through the conveyorized system. The conveyor speed of the work pieces is preferably varied when the work pieces to be processed at the changed speed have already been processed in the system during a certain fraction of the overall processing time and when other work pieces, which follow these work pieces in the system and are to be processed at another set conveyor speed, are already located in the system. In this case, the electric currents originating from the counter electrodes must be compensated for adjusting the processing conditions for the work pieces of concern to the reference conditions.

In order to permit individual adjustment of the electric currents originating from the counter electrodes, current-controlled current supply units such as electrolytic cell rectifiers or unipolar or bipolar pulse generators are preferably used for current supply.

The counter electrodes are preferably arranged one behind the other in the direction of transport. They are more specifically electrically isolated to one another in order to prevent a current from flowing between the counter electrodes since the counter electrodes may have different potentials due to the current control.

Since the electric currents supplied to the work pieces causes a potential drop in a metallic coating of the work pieces, regions of the coating located at a great distance from an electric contacting location for the work pieces may possibly no longer be processed at a sufficient process potential so that processing these regions becomes impossible. In segmenting at least some of the counter electrodes substantially transverse to the direction of transport, this potential drop may be compensated for by suitably controlling the current at the segments. In a preferred embodiment of the invention at least some counter electrodes are therefore segmented into counter electrode segments substantially transverse to the direction of transport. The electric current at each of these counter electrode segments may be individually settable. This segmentation and the individual control and setting of the currents originating from the segments permit to even further equalize the current density across the direction of transport of the work pieces in the plant. This is particularly advantageous when work pieces provided with a very thin metallic coating are to be processed since the electrical conductivity of the coating is too low to ensure uniform current supply to the coating without segmentation of the counter electrodes. In this case as well, it is advantageous to electrically isolate the counter electrode segments relative to one another in order to prevent electric current from flowing between the counter electrode segments.

For simplification of the description, the invention will only be described herein after for electrolytic metal-plating with direct current, preferably using examples of the printed circuit board technique in a conveyorized system through which the printed circuit boards are conducted in a horizontal orientation. In principle the invention also relates to electrolytic etching and to other electrolytic processing methods, though. The following Figs. serve to describe the invention.

Figure 1:
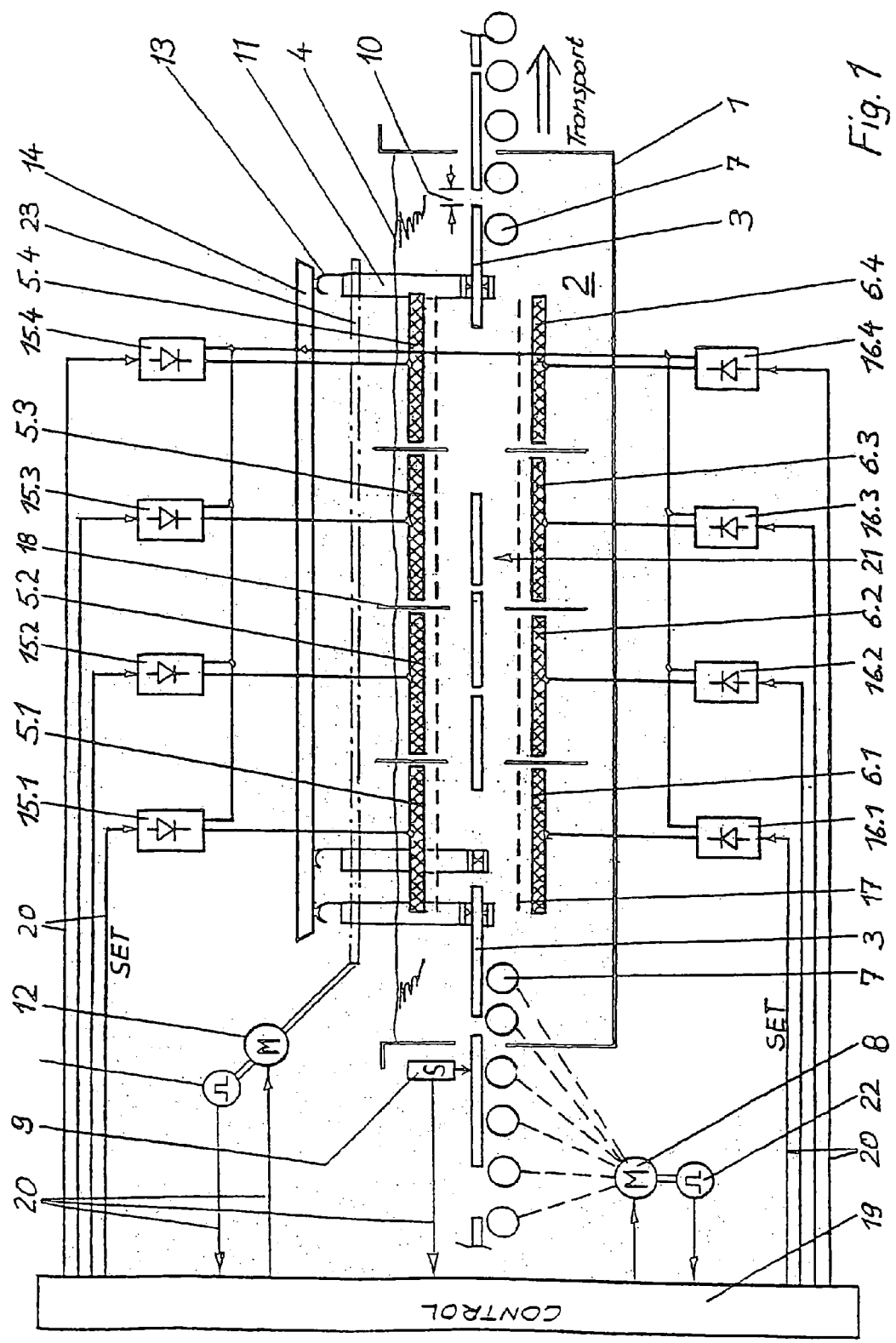
FIG. 1: is a schematic cross-sectional side view of a horizontal conveyorized metal-plating system.

The reference numerals indicated in the Figs. have the same significations. In this connection, the reader is also referred to the appended listing of numerals.

DETAILED DESCRIPTION OF THE INVENTION

The conveyorized system in FIG. 1 is provided with a plating tank 1. Said plating tank 1 is filled with an electrolyte 2. The electrolyte 2 is circulated by means of pumps (not shown) and is delivered to the board-shaped work 3. Such conveyorized systems are preferably used in the printed circuit board technique. In the following examples, the work pieces 3 are printed circuit boards or printed circuit films. However, the invention is not limited to the printed circuit board technique.

The level 4 of the electrolyte 2 extends beyond the upper anodes 5.x (5.1, 5.2, 5.3, 5.4) that are intended to be used for electrolytically processing the upper side of the printed circuit boards 3. The lower anodes 6.x (6.1, 6.2, 6.3, 6.4) serve to concurrently electrolytically process the underside of the printed circuit boards 3. The upper and lower anodes 5.x, 6.x may be soluble or insoluble anodes. The printed circuit boards 3 are introduced into the plating tank 1 through a slot-shaped opening by means of transport rolls 7 or transport wheels. The transport rolls 7 are driven by shafts and gears of roll driving motors 8. A position sensor 9 scans the advancing column of printed circuit boards and senses the length of every printed circuit board 3 and, as a result thereof, the length of the gaps 10 between two printed circuit boards 3 as well. In electrolytic metal-plating systems for printed circuit boards 3, the transportation speed usually amounts to 0.15-3 m/min. Inside the plating tank 1, the printed circuit boards 3 are grasped by endless revolving clamps 11 as they are entering the system, are electrically contacted and conveyed through the system. A clamp driving motor 12 is responsible for the transportation of the clamps placed in a row on a belt 23, cog belt or chain. One sliding contact 13 for each clamp serves to electrically contact the clamps 11. These sliding contacts 13 slide on a common sliding rail 14 that is electrically connected to a pole of the upper electrolyte cell rectifier 15.x (15.1, 15.2, 15.3, 15.4) and with the corresponding pole of the lower electrolyte cell rectifier 16.x (16.1, 16.2, 16.3, 16.4). The other pole of the electrolyte cell rectifier 15.x, 16.x is electrically connected to one associated anode 5.x, 6.x only. An electrolyte cell rectifier 15.x, 16.x is thus capable of supplying an upper or a lower anode 5.x, 6.x. It may also supply a group of upper or lower anodes 5.x, 6.x or anode segments when the length of the anodes 5.x, 6.x in the direction of transport (see arrow) is selected to be small.

In the increasingly applied fine line technique, highest precision with regard to the coating thickness is required. This is achieved by forming a plurality of individual electrolytic cells 21 in the conveyorized system, said cells consisting each of but one single anode 5.x, 6.x and of the printed circuit board 3 located above or below, which is the cathode. It is particularly advantageous to adjust the length of the anodes 5.x, 6.x individually supplied with electric current to the length of the shortest printed circuit board 3 to be processed for example, viewed in the direction of transport of the printed circuit boards 3. An optimum with regard to the possibilities for the production, the flexibility and the precision in electrolytic processing is thus achieved for printed circuit boards 3 that are to be processed in different ways while being simultaneously in the conveyorized system. Measured in the direction of transport of the printed circuit board 3, an anode 5.x, 6.x having such dimensions may in practice be 400 mm long for example. It is individually supplied with current by an electrolyte cell rectifier 15.x, 16.x. The term electrolyte cell rectifier is to be construed as a direct current source, a unipolar impulse current source or a bipolar impulse current source.

When the spacings between anodes 5.x, 6.x and printed circuit boards 3 are small, an ion permeable insulator 17 arranged in a flat manner may be mounted between the anodes 5.x, 6.x and the printed circuit boards 3 to prevent shorts. Said insulator prevents electric current from shorting, particularly when the anode-cathode spacing is small. More particularly during the electrolytic metal-plating of thin printed circuit boards (printed circuit films) 3, there would otherwise be a risk that the electrolyte flow causes the films 3 to deviate, causing them to contact the anodes 5.x, 6.x as a result thereof. The insulator may be in the form of perforated or slotted plastic boards, plastic meshes or cloths for example.

The potential in the anodes 5.x, 6.x may differ because of the individual current supply. It is therefore advisable to also isolate the anodes 5.x, 6.x relative to one another in order to prevent neighboring anodes 5.x, 6.x from reciprocally electrolytically metal-plating and etching one another. Isolating strips 18 arranged between the anodes 5.x, 6.x serve this purpose.

The electrolytic, horizontal conveyorized system is controlled by a main control unit 19, designated at CONTROL. By means of the configuration data of the system (transportation speed, position of the sensor 9, dimensions and position of the anodes 5.x, 6.x), of the set points of the data of the to-be-produced printed circuit boards 3 (dimensions, electrolytically to be processed surface, current density) and of the actual position data of the printed circuit boards 3 in the plant, the control unit 19 computes the actual, individual reference current for each current source 15.x, 16.x. After each calculation, said reference current is transmitted in the form of an electrical signal to the corresponding electrolyte cell rectifier 15.x, 16.x via control lines 20 indicated at SET. In the electrolyte cell rectifiers 15.x, 16.x, respective controlling means ensure that the individually computed currents flow through the respective one of the electrolytic cells 21 in the form of metal-plating currents formed by the anode 5.x, 6.x forming the boundary of said cell and by the printed circuit boards 3.

At a predetermined current density, the processing current required in every electrolytic cell 21 depends on the to be processed surface area of the printed circuit board 3 which is in the electrolytic cell at the moment. At first, this surface area is not constant as a first printed circuit board 3 is being introduced into the conveyorized system into an electrolytic cell 21 since it also depends on the movement of the printed circuit board 3. As the printed circuit boards 3 advance, the surface area of the printed circuit boards which are in the plant at the moment increases from zero until it completely occupies every electrolytic cell. The processing current must increase in accordance with the increase in surface area. The term surface area is always to be construed as the electrolytically to be processed surface area. During the patterning of printed circuit boards 3, this area may considerably depart from the geometrical surface area since only the circuit traces and the soldering and/or bonding pads are to be processed and not electrically isolating surface areas such as regions coated with a solder resist. When the transportation speed is constant, the increase in surface area per unit time in the electrolytic cell is constant when the counter electrodes are not segmented or are segmented in the direction of transport. As may be inferred from simple geometrical considerations, the increase in surface area per unit time is not constant when the counter electrodes are not segmented in the direction of transport but at an angle to the direction of transport.

To track the printed circuit boards 3 through the electrolytic cells 21, the driving motors 8 for the transport rolls or wheels 7 and the driving motors 12 for the clamps 11 are coupled to drive sensors 22, e.g., to incremental displacement encoders. Furthermore, at least one position sensor 9 senses the position of the printed circuit boards 3 by way of the edges thereof and of the distance separating them from other printed circuit boards 3. In the control unit 19, the signals of the position sensor 9 and of the drive sensors 22 are logically processed in such a manner that an accurate instant picture of the degree at which the conveyorized system is filled with printed circuit boards 3 is available at all times. To calculate the actual conveyor speed of the printed circuit boards 3, an alternative consists in considering their length (product data) and the time difference of signals measured at the sensor 9 from the time at which the leading edge of a printed circuit board 3 is moved past until the time at which the trailing edge is moved past. By means of the computed instantaneous surface areas, the control unit 19 for every electrolytic cell 21 generates instantaneous set points of the electric current for the electrolyte cell rectifiers 15.x, 16.x. To calculate these set points, the dimensions of the printed circuit boards 3 or those surfaces areas thereof that are relevant for plating, more specifically the width transverse to the direction of transport, are considered on top of the required current density.

In practice, the printed circuit boards 3 are usually narrower than the anodes 5.x, 6.x. In this case, the anodes 5.x, 6.x project beyond the lateral borders of the printed circuit boards. In this lateral region of the printed circuit boards 3, burns which are due to too high current densities as a result of the field line concentration (point effect) must be avoided. For this purpose however, the known and technically complicated, adjustable screening shields are not made use of. In accordance with the invention, a small distance between the plane of transportation in which the printed circuit boards 3 are conveyed and the anodes 5.x, 6.x (anode-cathode spacing) is provided in the electrolytic cells 21 instead. This small spacing of 50 mm maximum permits to avoid too high a field line concentration not only at the lateral side of the printed circuit boards 3 parallel to the direction of transport but at all of the edges of the printed circuit boards 3, more specifically at the leading and trailing edges of the printed circuit boards 3 as well. As a result thereof, the gaps between the printed circuit boards 3 of a column may be any size without the mentioned burns occurring at the leading and trailing edges.

To achieve the current density which is provided for and efficient on the entire surface, the current must be permanently calculated and possibly adjusted because electrolytically to be processed surfaces the size of which changes permanently due to the transportation of the boards 3 are located below the anodes 5.x, 6.x. The solution of this problem is to constantly logically track the printed circuit boards 3, as already described, in the conveyorized system and to constantly calculate the surface areas to be presently processed at the anodes 5.x, 6.x. The control unit 19 for the current supply units 15.x, 16.x calculates and, as a result thereof, permanently varies the actual set points of the electric currents of the individual electrolyte cell rectifiers 15.x, 16.x for each anode 5.x, 6.x. It is only by combining this permanent computation of the set points of the metal-plating current with the adjustment of the metal-plating current and with a small anode-cathode spacing that it is possible to produce printed circuit boards 3 with gaps of any size in a column of boards 3 without the disadvantages described arising.

At a cathode current density of approximately 12 A/dm², an anode-cathode spacing of 2-15 mm should be set. If a smaller cathode current density of approximately 5 A/dm² is selected, the anode-cathode spacing may be selected greater, e.g., 20-50 mm. In these cases, the screening shields described for example in WO 98 49 375 A2, which are used in the case of a greater anode-cathode spacing, may be dispensed with.

As the printed circuit boards 3 enter the electrolytic cells 21, the processing current is continuously increased as described so that a substantially constant cathodic current density is always active at the surfaces of the printed circuit boards 3. This increase in electric current is also called positive current ramp. As the last printed circuit board 3 of a printed circuit board column exits the conveyorized system, a decreasing electric current is accordingly required in every electrolytic cell 21 of concern in order to meet the required processing current density. These negative current ramps are also computed in the control unit 19 and are transmitted to the electrolyte cell rectifiers 15.x, 16.x in the form of an electrical signal for setting the electric current accordingly.

In a conveyorized system, anodes may for example be provided both above and beneath a horizontal plane of transportation for electrolytically metal-plating printed circuit boards. At a randomly selected time, two printed circuit boards are to be inside the plant: a first board A and a second board B. The first board A is to still be with 20% of its surface area inside an electrolytic cell which is formed by one of the anodes, this fraction of the surface area of board A and a fraction of 60% of the surface area of board B with which said board B is already located inside said cell. The board A is on the point of exiting the electrolytic cell whereas the board B is entering the cell.

The computation of the electric current originating from the anode is based on an electrolytically active (effective) total area of the board A of 10.5 dm² (30 cm×35 cm), the board being conducted through the plant in longitudinal direction (the leading edge has a length of 30 cm). The electrolytically active surface area portion of board B amounts to 6 dm² (20 cm×30 cm), the board being also conducted through the plant in longitudinal direction (the leading edge has a length of 20 cm). At a set point of the current density of 10 A/dm², the electric current originating from the anode amounts to:

$$I=(10\ A/dm^2 \cdot 20\% \cdot 10.5\ dm^2)+(10\ A/dm^2 \cdot 60\% \cdot 6\ dm^2)=57\ A.$$

For each anode, the electric current is computed repeatedly at short intervals, of 1 sec for example. At a transportation speed of 2 m/min for the two printed circuit boards A and B, these boards are advanced approximately 3.3 cm within this time interval as a result thereof. Having been advanced 3.3 cm, approximately 10.5% of the board A are still inside the electrolytic cell as approximately (3.3 cm/35 cm=) 9.5% of this board have left the cell. Now, approximately 71.1% of board B is in the cell since a surface area fraction of approximately (3.3 cm/30 cm=) 11.1% of this board has meanwhile entered the cell. As a result thereof, the actual current at the anode is:

$$I=(10\ A/dm^2 \cdot 10.5\% \cdot 10.5\ dm^2)+(10\ A/dm^2 \cdot 71.1\% \cdot 6\ dm^2)=53.7\ A.$$

As a result thereof, the electric current at this anode must be set down from 57 A to 53.7 A within 1 second.

Above, there has been described the electrolytic processing of a column of printed circuit boards 3 with the same set points of the current density for all of these printed circuit boards, said printed circuit boards being spaced any distance apart without using dummies in front of or behind the column and without using screening shields either. The invention moreover meets further requirements encountered in practice which, according to the state of the art, could hereto before not be realized in conveyorized systems. These include the concurrent electrolytic processing of two or several columns of printed circuit boards 3 in one conveyorized system with various current densities without dummies having to be intercalated at the transition from the first column of printed circuit boards 3 to the second column.

Figure 2:
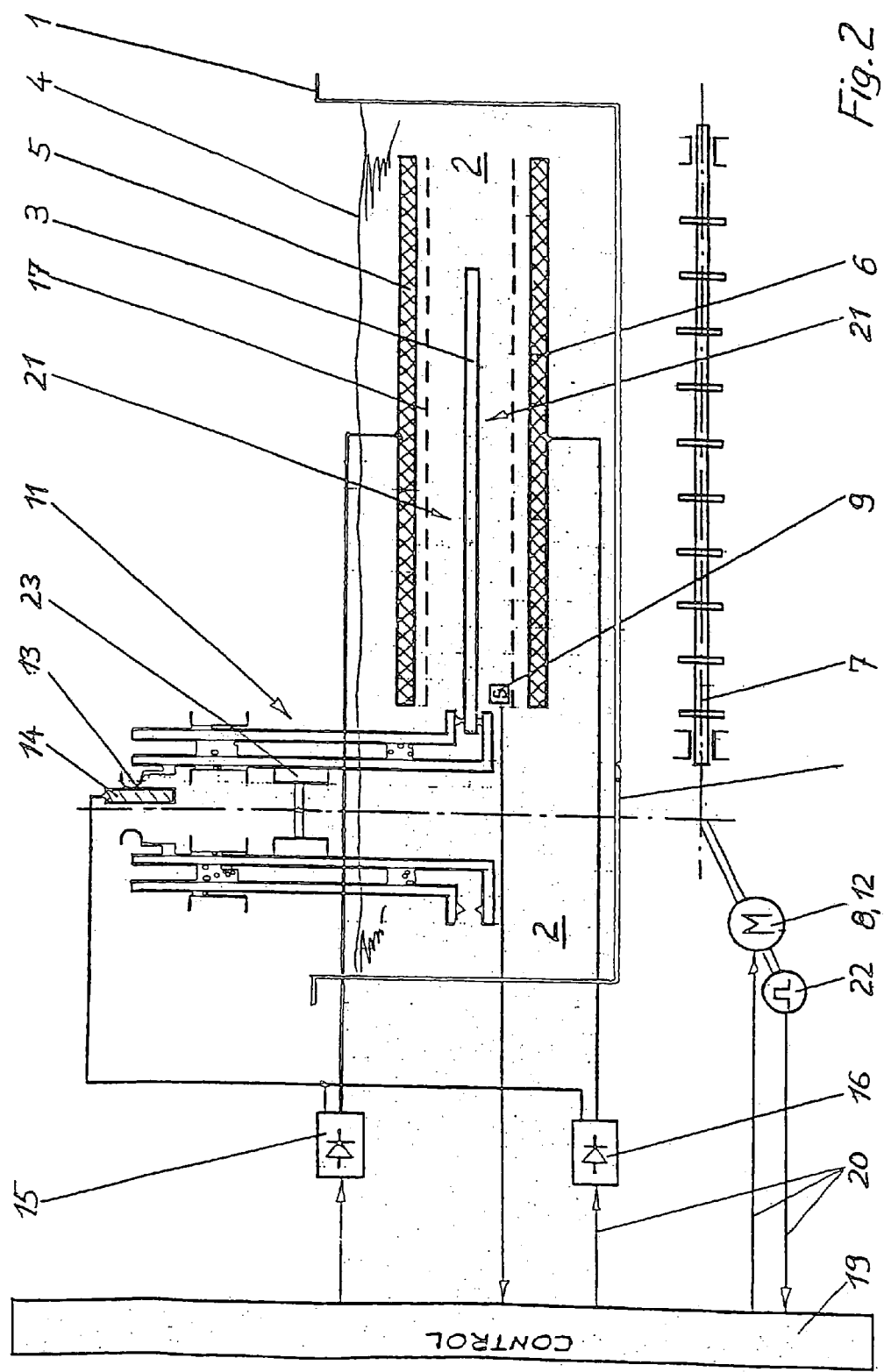
FIG. 2: is a schematic cross-sectional front view of the system shown in FIG. 1,
FIG. 3: is a schematic top view of the system shown in FIG. 1.

Finally, in the case of a change of product, the transportation speed of the printed circuit boards may also be varied without having before to run the conveyorized system without charge as this was the case hereto before and without having in these cases to add dummies at either end of the row of printed circuit boards. In all of the cases, the required coating thickness is accurately met for all of the printed circuit boards. This will be explained in closer detail herein after with reference to the further drawings:

FIG. 2 is a schematic cross-sectional view of the horizontal conveyorized system. Here, the printed circuit boards 3 are conveyed into the plane of the drawing at right angles thereto. It may be surveyed therefrom that the anodes 5, 6 (transverse to the direction of transport) are wider than the printed circuit boards 3 that have been grasped and electrically contacted by the clamps 11. Thanks to the reduced anode-cathode spacing, no screening shields are needed. A position sensor 9 for sensing the actual positions of the respective one of the printed circuit boards 3 and of the gaps 10 between two printed circuit boards 3 is preferably located in the border region of the printed circuit boards' 3 transport path. Concurrently the sensor 9 verifies that the printed circuit boards 3 are oriented correctly so that they may be grasped by the clamps 11.

FIG. 2 shows two rows of clamps 11 that endlessly revolve on a conveying belt 23, a cog belt or a chain. Every single clamp 11 is provided with a sliding contact 13 that abuts on a sliding rail 14 in the right row of clamps 11. The right row of clamps 11 is moved together with the printed circuit boards 3 they grasp into the plane of the drawing. The printed circuit boards 3 are thereby supplied with electric current through the sliding rail 14, the sliding contact 13 and the clamp 11. The clamps 11 represented on the left side hold no printed circuit boards 3 and are moved out of the plane of the drawing. The clamps 11 not only serve to supply the printed circuit boards 3 with electric current but also to convey the printed circuit boards 3. For completeness, an outer transport wheel shaft 7 which is offset downward in the drawing is also illustrated in FIG. 2. In practice, the wheels for supporting and transporting the printed circuit boards 3 are located directly underneath the plane of transportation in which the printed circuit boards 3 are being conveyed.

FIG. 3 is a schematic top view of a horizontal conveyorized system. For simplification sake, the plant has been represented with only four upper counter electrodes 5.x (5.1, 5.2, 5.3, 5.4) and with the associated electrolyte cell rectifiers 15.x (15.1, 15.2, 15.3, 15.4). In practice, such a system is comprised of up to 20 upper and 20 lower counter electrodes 15.x, 16.x, i.e., of 20 anode pairs. In the system shown in FIG. 3, there are three different kinds of printed circuit boards 3.x (3.1, 3.2, 3.3), i.e., columns of different printed circuit boards 3.x. Another printed circuit board 3.4 is just in front of the plant. The printed circuit boards 3.x are conveyed through the plant in the direction of transport (shown by the arrow).

It may be surveyed therefrom that there are printed circuit boards 3.x of various board formats spaced different distances apart inside the conveyorized system, i.e., the gaps 10 between the printed circuit boards 3.x have various sizes. The respective electrolytic effective surface areas Ax (A1, A2, A3, A4, A5, A6, A7), which overlap with the respective one of the anodes 5.x, are shown in hatched line. These surface areas are the surface areas Ax which presently are located below the anodes 5.x. These projections constitute an instantaneous view. They vary constantly in function of the forward feed. The surface areas are constantly recalculated, e.g., after a forward feed of 2.5-60 mm or in time intervals of 500 msec -20 sec.

The sum of the surface areas Ax presently located within the region of an anode multiplied by the set point of the current density yields the bath current the electrolyte cell rectifiers 15.x have to set at the moment. In practice it proved to be a very good value to update the bath current after a forward feed of approximately 10 mm. Accordingly, at a transportation speed of 2 m/min, all of the rectifier currents are to be updated approximately 3 times a second. This may be realized at low cost with the control systems available. The current varies in small steps. With previous calculation it is also possible to continuously vary the electric current. In this case, the electrolyte cell rectifiers 15.x are continuously triggered with a reference current value signal. Usually, this is an analog value.

In FIG. 3, only area A1 is presently located under the anode 5.4. The areas A2 and A3 are located directly opposite the anode 5.3. The areas A4 and A5 are located directly opposite the anode 5.2 and the areas A6 and A7 are located under the anode 5.1. The printed circuit boards 3.1 and 3.2 are spaced one counter electrode length apart in the direction of transport. This permits to set various current densities for the printed circuit boards 3.1 and 3.2 without any disadvantage. The printed circuit boards 3.2 and 3.3 are conveyed separated by gaps that are smaller than the length of the anode. Due to the small gaps, the current density for these printed circuit boards 3.2, 3.3 cannot be varied because these printed circuit boards 3.2 and 3.3 are momentarily located below or above the same anode 5.1. Position sensor 9 senses the size of the gaps. The gaps are taken into consideration in the instantaneous computation of the surface area in the control unit 19.

If various printed circuit board products are to be processed at the same current density for different lengths of time, the transportation speed of the printed circuit boards 3.x is varied. In practice, this is carried out when the boundary transition line between the two columns of printed circuit boards that are to be processed in different manners is located approximately in the center of the conveyorized system. In for example increasing the speed, the leading printed circuit boards 3.2 (those being advanced in front of the boundary transition line) are processed in too short periods of time. This is compensated for by a temporary specific increase in the current density in that region of the system in which the printed circuit boards 3.2 are located until there are only trailing printed circuit boards 3.3 left in the conveyorized system. If the speed is reduced, the current density of the corresponding anodes 5.4 is automatically temporarily reduced accordingly. It is hereby no longer necessary to run the conveyorized system without charge, as this was the case hereto before.

In practice, a change in product during the charging of a conveyorized system is foreseeable. Therefore, a gap 10 of at least one counter electrode length between two columns of printed circuit boards is controllably met when the printed circuit board products are to be processed at various current densities. Again, the conveyorized system needs no longer be run without charge.

Unplanned gaps 10 between the printed circuit boards 3.x, as they occur in practice are not foreseeable, though. Printed circuit boards may for example be removed from the column for test purposes or there is a jam in the plant occasioned by disturbances, the boards 3.x being shifted over each other as a result thereof. In realizing the present invention, the printed circuit boards 3.x located in front of or behind a gap 10 are no longer scrap.

When the sequence of the printed circuit boards 3.x does not change after they have entered the charging station of the plant, the corresponding (overlapping) anode and printed circuit board (cathode) surface areas in every electrolytic cell are known at all times. These data are calculated and stored at all times in the main control unit to compute the actual electrolyte cell rectifier set points of the electric currents and the current ramps. In every electrolyte cell rectifier 15.x, the momentarily required processing current is set by controlling and adjusting means known in the measuring and control technique. In order for these electric currents to be distributed evenly over the surfaces of the printed circuit boards 3.x and for their edges not to be preferentially processed, a small enough anode-cathode spacing is selected in the electrolytic cells—as described herein above.

The anodes may be configured to be non-segmented or to be segmented transverse to the direction of transport (not illustrated herein). In the case of a segmented anode, each anode segment is allocated to an individual electrolyte cell rectifier. The momentarily corresponding surface areas of the printed circuit boards 3.x are also calculated individually for each anode segment. In turn, the set points of the electric current values for the electrolyte cell rectifiers are formed therefrom. As the number of electrolyte cell rectifiers in a conveyorized system increases, it is appropriate to provide the electrolyte cell rectifiers 15.x with a control link to the main control unit 19 via a serial bus system such as Profibus or Ethernet.

If printed circuit boards 3.x are to be electrolytically metal-plated that are provided with a very thin copper cladding b of a thickness ranging from 0.5-5 μm, the invention may also be used to limit the initial current density in order to avoid burns for example. By means of the data stored in the control unit 19, the initial current density can be set to a reduced value by means of a correction factor. As metal-plating progresses, the current density may be dynamically adjusted in one or several steps or continuously up to the nominal current density in accordance with the increase in thickness of the conductive layer in order to permit fast and high-quality buildup of layers on the surface of the printed circuit boards.

Position sensor 9 may be located inside or outside the plating tank 1. If the sensor 9 is located inside the plating tank 1, it must be resistant to the electrolyte used. If it is positioned in proximity to the point where the clamps grasp the printed circuit boards 3.x, the sensor 9 also senses errors in transport that may occur between the admission of the printed circuit boards 3.x in the conveyorized system and the reaching of the clamps 11. A common motor 8, 12 with a drive sensor 22 as shown in FIG. 2 may also be substituted for the driving motors 8 and 12 shown in the FIGS. 1 and 3. In this case, the control measures for synchronizing the roll driving motor 8 and the clamp driving motor 12 are not applicable.

The invention is not only suited for the electrolytic processing of electrical printed circuit boards but also for processing work that is to be electrolytically metal-plated, etched or processed in any other way on only one surface side. Further, it is also unrestrictedly suited for vertical conveyorized system in which the work is transported and processed in a vertical orientation and in a horizontal direction of transport.

From the foregoing, it is apparent that the present invention is a method of electrolytically processing surface areas of work pieces, such as printed circuit boards, where the electrolytically active portions for plating can be the circuit lines and pads on the boards, which often constitute less than the total geometric area of a PC board. The work pieces are passed in a conveyorized system through a plating bath in a single direction of transport, where the PC boards are electrolytically processed by successive electric currents from a series of electrodes. These electrodes are counter electrodes (either anodes or cathodes depending upon the polarity). The individual current from each respective electrode is individually set to a desired electrolytic value by a central or main control unit which computes each individual instantaneous current for each individual electrode as a function of the electrolytical active surface immediate to that individual electrode. The computation or re-computation of current from each electrode is done on a period basis of short increments of time determined in relation to the speed of the conveyor, i.e., the speed of the boards passing each electrode and the size of each board. In the re-computation and adjustment of current where PC boards overlap a respective electrode, the instantaneous current calculation for that electrode takes into consideration not only the electrolytically active area of the PC board(s) as a percentage of the total area of the board, but also that portion or percentage of the total board which overlaps the electrode at the instant of time of the re-computation and adjustment.

As successive, adjacent electrodes can be at different current levels at any instant of time, the counter electrodes are insulated (electrically isolated) from one another to reduce losses due to current flow between adjacent counter electrodes. The faces of each PC board are not permitted to touch the counter electrodes. However, the spacing between PC board faces and counter electrodes is minimized, such as being selected at a value in the range of 2 mm to 50 mm, with a preferred range of 2 mm to 15 mm.

As shown in the figures and understood from the foregoing description, the currents from each individual electrode in the succession of electrodes, i.e., the upper anodes 5, 5.1, . . . 5.x, and the lower anodes 6, 6.1, . . . 6.x (FIGS. 1 and 3), are each individually set by the control unit, which facilitates the plating of the PC boards even where the upper circuit pattern differs from the lower circuit pattern.

The PC boards are cathodic. As a cathode, electrochemically positively charged cations move to each PC board and negatively charged anions move away to balance the electrons arriving at the cathode from external circuitry. The electron movement facilitates the plating of metal onto the circuit pattern and/or pads on a face of a PC board.

In setting the instantaneous current for a particular electrode, its value is mathematically computed to a value proportional to the percentage of the total electrolytically active area of the particular PC board then momentarily opposite, i.e., positioned adjacent to (or positioned in front of) the particular electrode. This calculated value for the adjustment of the current of the electrode at that position also is a function of desired current density determined for the particular PC board at that particular electrode position along the conveyor.

The foregoing two equations recite examples of a calculation of a current value for an adjustment of the momentary current (i.e., for a processing period) supplied to flow from a counter electrode. These equations are:

$$I=(10\ A/dm^2 \cdot 20\% \cdot 10.5\ dm^2)+(10\ A/dm^2 \cdot 60\% \cdot 6\ dm^2)= 57\ A \quad (1)$$

$$I=(10\ A/dm^2 \cdot 10.5\% \cdot 10.5\ dm^2)+(10\ A/dm2 \cdot 71.1\% \cdot 6\ dm^2)=53.7\ A. \quad (2)$$

The first of the two equations determines the instantaneous plating current (I) for the electrode where a first board (A) has a 20% (percent) overlap and a second board has a 60% (percent) overlap. The first board has a total electrolytically active area of 10.5 $dm^2$ (1050 $cm^2$), while the second board has a total electrolytically active area of 6 $dm^2$ (600 $cm^2$). The desired current density at that position in the conveyor has been calculated at 10/$dm^2$ for both the first (A) and second (B) boards. The component of the current for the first board (A), therefore, is 10 amps/$dm^2 \times 20\% \times 10.5\ dm^2$, or 21 amps. The component of current for the second board (B) is 10 amps/$dm2 \times 60\% \times 6\ dm2$, or 36 amps. The total current delivered to the electrode and therefore into the bath is the sum of the calculated values or 57 amps.

For each counter electrode along the conveyor, its individual current is calculated at the process "cycle rate" set for the system. Process cycle times (rates) are set at intervals in the range of from 500 ms to 20 sec, where an acceptable interval time is established for a run of particular work pieces. The interval between calculations and adjustment of current values is affected by the travel distance, i.e., the change of position of a PC board between calculations. This time interval range equates to a distance in the range of 2.5 mm to 60 mm. Boards are sequenced as closely together as possible, with a spacing of 15 mm, maximum, between them.

It is understood that the process rate establishes the moment or instance in time for each successive adjustment of current value from a particular electrode. It is also understood from the foregoing that individual current adjustment is individually specific for each electrode. The conveyor system has a single position sensor which senses the leading edge and trailing edge of each work piece (PC board) as it enters onto the conveyor. The speed of the conveyor motor drive and the speed of the feed rollers is monitored and used to calculate the physical position of each PC board as it is conveyed through the plating bath.

It will be understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

LISTING OF NUMERALS

| | |
|---|---|
| 1 | plating tank |
| 2 | electrolyte |
| 3, 3.1, 3.2, 3.3, 3.4, 3.x | work, work pieces, e.g., printed circuit boards |
| 4 | level of the electrolyte |
| 5, 5.1, 5.2, 5.3, 5.4, 5.x | upper anode, counter electrode |
| 6, 6.1, 6.2, 6.3, 6.4, 6.x | lower anode, counter electrode |
| 7 | transport roll, transport wheel shaft |
| 8 | roll driving motor |

-continued

| | |
|---|---|
| 9 | position sensor |
| 10 | gap between printed circuit boards |
| 11 | clamp |
| 12 | clamp driving motor |
| 13 | sliding contact |
| 14 | sliding rail |
| 15, 15.1, 15.2, 15.3, 15.4, 15.x | upper electrolyte cell rectifier, current source |
| 16, 16.1, 16.2, 16.3, 16.4, 16.x | lower electrolyte cell rectifier, current source |
| 17 | ion permeable insulator |
| 18 | isolating strip |
| 19 | main control unit |
| 20 | control lines |
| 21 | electrolytic cell |
| 22 | drive sensor |
| 23 | conveying belt, chain |
| A1, A2, A3, A4, A5, A6, A7, Ax | electrolytically active surface area |

The invention claimed is:

1. A method of electrolytically processing surface areas of work pieces, said work pieces each having an electrolytically active surface area, in a conveyorized system in which the respective work pieces are conducted through the system in one direction of transport in which the respective work pieces are electrolytically processed by means of electric currents originating from each of a plurality of counter electrodes, which are each supplied with an individual current source, the counter electrodes being located one behind the other in the direction of transport as the work pieces are conducted past the counter electrodes, wherein a respective individual electric current originating from each of the said respective counter electrodes is set independently from the respective individual electric currents of all other counter electrodes to an individual electric current value for providing a respective desired current density at the surface of one or more respective work pieces which overlaps with said respective counter electrode, wherein said respective individual electric currents originating from each of the said respective counter electrodes are individually adjusted for each respective counter electrode separately proportionally to the overlapping area between the said respective work piece and the respective counter electrode and proportionally to an electrolytically active surface portion of said overlapping area and proportionally to the desired electric current density at said electrolytically active surface area portion, wherein adjacent counter electrodes are isolated from one another in order to prevent a current flowing between the said adjacent counter electrodes, and wherein the work pieces are conducted past the counter electrodes at a distance of 50 mm maximum.

2. The method according to claim 1, wherein the respective electric current originating from a respective counter electrode is momentarily controlled for said respective work piece momentarily opposite said respective counter electrode, by determining the total area of said work piece and by determining the sum of the electrolytically active surface areas of said work piece, and by calculating the respective electric current as a function thereof.

3. The method according to one of claims 1-2, wherein the electric currents originating from said individual respective counter electrodes are set proportionally to the electrolytically to be processed surface areas of each said work piece.

4. The method according to one of claims 1-2, wherein said electrolytically active surface areas of each said respective work piece located directly opposite a said respective counter electrode is determined by determining the electrolytically active surface areas of said work piece and the overlap of the work piece with said respective counter electrode.

5. The method according to claim 4, wherein the overlap of a work piece with an individual respective counter electrode is determined by determining the position of said work piece to said counter electrode and by calculating said overlap when considering the shape of the work piece and the shape of the counter electrode.

6. The method according to claim 5, wherein the position of the work piece in the conveyorized system is determined by determining a predetermined position and by determining the time at which the work piece is conducted past said predetermined position and by thereafter tracking the work piece in said conveyorized system, starting from the predetermined position.

7. The method according to claim 6, wherein said position of the work piece in the conveyorized system is determined in time intervals of up to 20 sec.

8. The method according to claim 5, wherein the position of the work piece in the conveyorized system is determined after the work piece has been advanced in the direction of transport by 60 mm maximum.

9. The method according to claim 6, wherein the work piece is tracked within the conveyorized system by determining the distance traveled by the work piece by integrating the conveyor speed of the work piece over time or by adding impulses of an incremental or absolute displacement encoder.

10. The method according to one of the afore mentioned claims 1-2, wherein the electric currents originating from each respective counter electrode are additionally set with a correction factor in function of the electric conductivity of each respective work piece conducted past said respective counter electrode in such a manner that burns of metal deposits are avoided.

11. The method according to claim 10, wherein said electrolytical processing deposits metal plating on said work piece and wherein the correction factor is set smaller or greater than 1 and wherein, during said metal-plating, the correction factor continuously or gradually increases to 1, starting from a small value, or drops to 1, starting from a high value, as the thickness of the metal deposit increases.

12. The method according to one of claims 1-2, wherein the distance at which the work pieces are conducted past the counter electrodes is selected in function of the electric current density at the work pieces.

13. The method according to claim 12, wherein the distance ranges from 2-15 mm.

14. The method according to one of claims 1-2, wherein work pieces that are to be electrolytically processed are separated from each other by a gap extending in the direction of transport as they are conducted through the conveyorized system, said gap being at least as large as the length of the counter electrode in the direction of transport.

15. The method according to one of claims 1-2, wherein the conveyor speed of work pieces that are to be electrolytically processed in the conveyorized system is changed as said work pieces are conducted through the conveyorized system and wherein a resulting difference in the effect of the electrolytic processing on various work pieces is compensated for by adjusting the electric currents originating from the various counter electrodes as the work pieces are conducted past them.

16. A method of electrolytically processing surface areas of work pieces in a conveyorized system, comprising the steps of:

conducting work pieces sequentially through said system;
electrolytically processing each work piece by a respective individual electric current originating from each one of serially arrayed counter electrodes, which are each supplied with an individual current source, as said work pieces are conducted past said serially arrayed counter electrodes at a minimum distance therefrom;
said electrolytically processing including individually setting a momentary value of electric current from each respective counter electrode to provide desired current density at the surface of a respective work piece momentarily positioned opposite thereto and momentarily overlapping with said counter electrode; and
wherein each said current density momentary value is adjusted proportionally to the overlapping area between the said respective work piece and the respective counter electrode and proportionally to an electrolytically active surface percentage of said overlapping area and proportionally to said desired current density at said electrolytically active surface portion.

17. The method of claim 16, also including the step of isolating said counter electrodes from one another to prevent current flowing there between.

* * * * *

UNITED STATES PATENT AND TRADEMARK OFFICE
CERTIFICATE OF CORRECTION

PATENT NO. : 7,563,352 B2  Page 1 of 1
APPLICATION NO. : 10/488352
DATED : July 21, 2009
INVENTOR(S) : Egon Hubel It is certified that error appears in the above-identified patent and that said Letters Patent is hereby corrected as shown below:

On the title page, item [54]: Title, replace "METHOD AND CONVEYORIZED SYSTEM FOR ELECTORLYTICALLY PROCESSING WORK PIECES" with -- METHOD AND CONVEYORIZED SYSTEM FOR ELECTROLYTICALLY PROCESSING WORK PIECES --;

Column 1, lines 1 - 3, replace "METHOD AND CONVEYORIZED SYSTEM FOR ELECTORLYTICALLY PROCESSING WORK PIECES" with -- METHOD AND CONVEYORIZED SYSTEM FOR ELECTROLYTICALLY PROCESSING WORK PIECES --.

Signed and Sealed this

Twenty-ninth Day of September, 2009

David J. Kappos
*Director of the United States Patent and Trademark Office*